(12) United States Patent
Sunohara et al.

(10) Patent No.: US 7,656,023 B2
(45) Date of Patent: Feb. 2, 2010

(54) ELECTRONIC PARTS PACKAGING STRUCTURE AND METHOD OF MANUFACTURING THE SAME

(75) Inventors: Masahiro Sunohara, Nagano (JP); Mitsutoshi Higashi, Nagano (JP); Akinori Shiraishi, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 315 days.

(21) Appl. No.: 11/485,397

(22) Filed: Jul. 13, 2006

(65) Prior Publication Data

US 2007/0029654 A1 Feb. 8, 2007

(30) Foreign Application Priority Data

Aug. 1, 2005 (JP) ............................. 2005-222973

(51) Int. Cl.
*H01L 21/302* (2006.01)
*H01L 21/461* (2006.01)

(52) U.S. Cl. ...................... 257/704; 257/709; 257/701; 257/729; 257/702; 438/125

(58) Field of Classification Search ......... 257/678–733; 438/106–127
See application file for complete search history.

(56) References Cited

U.S. PATENT DOCUMENTS

| 5,644,086 A | * | 7/1997 | Cahill et al. | .................. | 73/654 |
| 7,154,173 B2 | * | 12/2006 | Ikeda et al. | .................. | 257/704 |
| 2003/0080836 A1 | * | 5/2003 | Nagaishi et al. | .............. | 333/247 |
| 2004/0173751 A1 | * | 9/2004 | Komobuchi et al. | ....... | 250/338.1 |
| 2005/0205951 A1 | * | 9/2005 | Eskridge | ...................... | 257/416 |
| 2005/0269710 A1 | * | 12/2005 | Lee et al. | ..................... | 257/774 |
| 2006/0131731 A1 | * | 6/2006 | Sato | ........................... | 257/704 |
| 2007/0004080 A1 | * | 1/2007 | Ouyang | ...................... | 438/106 |

FOREIGN PATENT DOCUMENTS

| EP | 1 046 917 A2 | | 10/2000 |
| JP | 2000-235044 | | 8/2000 |
| JP | 2001-7346 | | 1/2001 |
| JP | 2001-110946 | * | 4/2001 |

\* cited by examiner

*Primary Examiner*—Zandra Smith
*Assistant Examiner*—Telly D Green
(74) *Attorney, Agent, or Firm*—Edwards Angell Palmer & Dodge LLP

(57) ABSTRACT

In an electronic parts packaging structure of the present invention, an electronic parts is mounted or formed on a silicon circuit substrate having a structure in which wiring layers on both sides thereof are connected to each other through a through electrode, and a protruded bonding portion which is ring-shaped and is made of glass, of a seal cap having a structure in which a cavity is constituted by the protruded bonding portion, is anodically bonded to a bonding portion of the silicon circuit substrate, thus, the electronic parts is hermetically sealed in the cavity of the sealing cap.

4 Claims, 6 Drawing Sheets

ELECTRONIC PARTS PACKAGING STRUCTURE AND METHOD OF MANUFACTURING THE SAME

CROSS-REFERENCE TO RELATED APPLICATIONS

This application is based on and claims priority of Japanese Patent Application No. 2005-222973 filed on Aug. 1, 2005, the entire contents of which are incorporated herein by reference.

BACKGROUND OF THE INVENTION

1. Field of the Invention

The present invention relates to an electronic parts packaging structure and a method of manufacturing the same. More specifically, the present invention relates to an electronic parts packaging structure having a structure in which an electronic parts is mounted in a state that the electronic parts is hermetically sealed with a sealing cap, and relates to a method of manufacturing the same.

2. Description of the Related Art

In the prior art, there have been electronic parts packaging structures having a structure in which an electronic parts is mounted in a state that the electronic parts is hermetically sealed on a circuit substrate with a sealing cap. For example, in a micro electro mechanical system (MEMS) device, a MEMS device formed on a substrate is mounted in a state in which it is hermetically sealed with a sealing cap.

In Patent Literature 1 (Japanese Unexamined Patent Publication No. 2000-235044), an acceleration sensor having a structure in which a glass cap is bonded to the top of a sensor chip is described, and a recessed portion is formed in the glass cap in order to ensure a space for the swinging of a weighting portion.

Furthermore, in Patent Document 2 (Japanese Unexamined Patent Publication No. 2001-7346), a method of manufacturing an external force sensor (FIG. 1) is described, and it is described that after a sensor device is made by anodically bonding a device substrate having a recessed portion provided in a lower central portion thereof to a supporting substrate and by forming through holes in the device substrate, a lid portion made of glass which includes a recessed portion may be further provided on the device substrate by anodic bonding.

On the other hand, in interposers on which various electronic parts is mounted or formed, silicon substrates are used instead of ceramic substrates and glass epoxy resins to meet a demand for higher densities. Moreover, interposers which have a structure in which through electrodes are provided in a silicon substrate to enable conduction between the two sides of the silicon substrate are proposed.

In recent years, there is a demand for mounting or forming various electronic parts on such a silicon substrate (interposers) having through electrodes provided therein and further hermetically sealing the electronic parts with a sealing cap. However, the technology in which a sealing cap is provided on a silicon substrate having through electrodes provided therein has not been fully established. Currently, it is under the situation in which such a technology is aspired.

SUMMARY OF THE INVENTION

An object of the present invention is to provide an electronic parts packaging structure in which a sealing cap can be provided on a silicon substrate (interposer) having a through electrode provided therein with a high level of reliability, and to provide a method of manufacturing the same.

The present invention relates to an electronic parts packaging structure including: a silicon circuit substrate having a structure in which wiring layers on both sides thereof are connected to each other through a through electrode; an electronic parts mounted or formed on the silicon circuit substrate; and a sealing cap including a ring-shaped protruded bonding portion in which at least a bonding part thereof is made of glass, and having a structure in which a cavity (50a) is constituted by the protruded bonding portion (50b), the protruded bonding portion of the sealing cap is bonded to a bonding portion of the silicon circuit substrate, wherein the electronic parts is hermetically sealed in the cavity of the sealing cap.

In the electronic parts packaging structure of the present invention, the silicon circuit substrate is used as an interposer, the through electrode is provided in the silicon circuit substrate, and the wiring layers on both sides of the silicon circuit substrate are connected to each other via the through electrode. The electronic parts (semiconductor device, imaging device, or MEMS device) is mounted or formed on the silicon circuit substrate, and the bonding portion where the substrate is exposed is provided in the silicon substrate outside the electronic parts. Furthermore, the protruded bonding portion (glass) of the sealing cap, in which the ring-shaped protruded bonding portion and the cavity are provided, is anodically bonded to the bonding portion of the silicon circuit substrate. Thus, the electronic parts mounted or formed on the silicon circuit substrate in which the through electrode provided is hermetically sealed in the cavity of the sealing cap.

In the present invention, the use of the silicon circuit substrate makes it possible to form high-density wiring. The provision of the through electrodes reduces wiring length, and makes it possible to easily cope with a higher-speed electronic parts. Also, the sealing cap can be easily provided on the silicon circuit substrate by bonding. Accordingly, even in the case where an electronic parts is mounted of which reliability is impaired by moisture or the like from outside air, the electronic parts can be easily hermetically sealed to improve the reliability thereof. Furthermore, since the silicon circuit substrate is used as an interposer, the thermal expansion coefficients of the electronic parts (silicon chip) and the interposer can be set equal to each other. Accordingly, the occurrence of thermal stresses is suppressed. This makes it possible to improve the reliability of a semiconductor device even in the case where an electronic parts (silicon chip) vulnerable to stresses is mounted.

As described above, in the present invention, the electronic parts mounted or formed on the silicon circuit substrate having the through electrode provided therein can be easily hermetically sealed with the sealing cap. Accordingly, the reliability of the electronic parts can be improved.

DESCRIPTION OF THE PREFERRED EMBODIMENTS

Hereinafter, embodiments of the present invention will be described with reference to the accompanying drawings.

First Embodiment

Figure 1A:
FIGS. 1A to 1Q are cross-sectional views showing a method of manufacturing an electronic parts packaging structure of a first embodiment of the present invention.
Figure 1B:
Figure 1C:
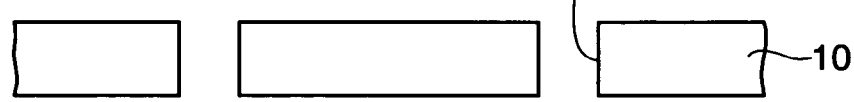
Figure 1D:
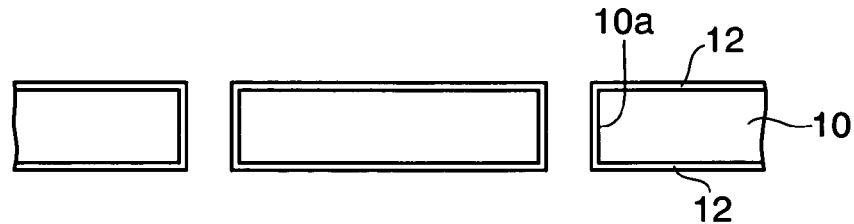
Figure 1E:
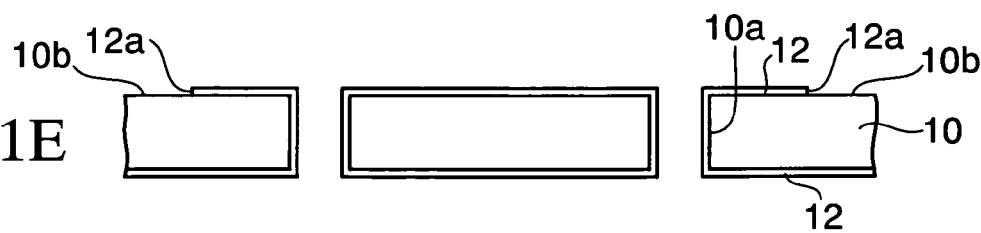
Figure 1F:
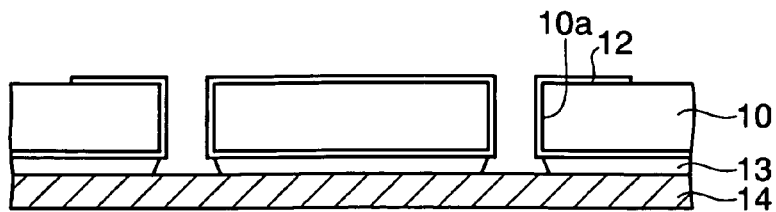
Figure 1G:
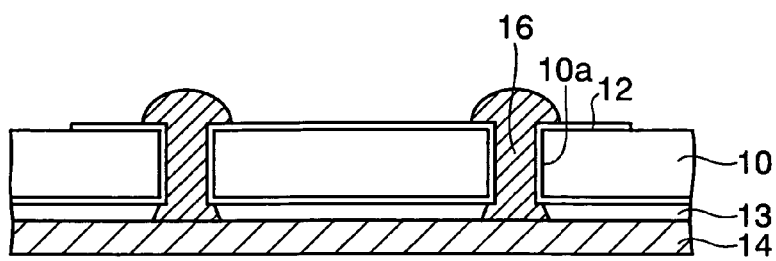
Figure 1H:
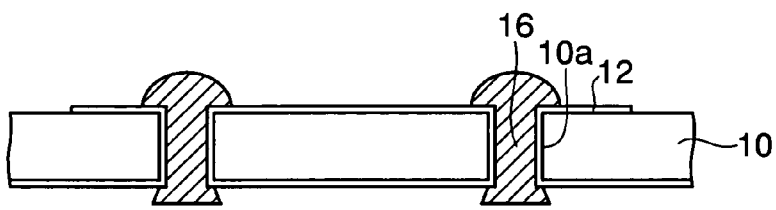
Figure 1I:
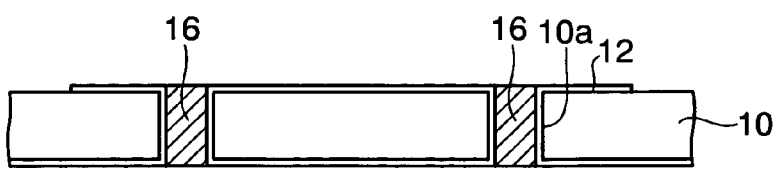
Figure 1J:
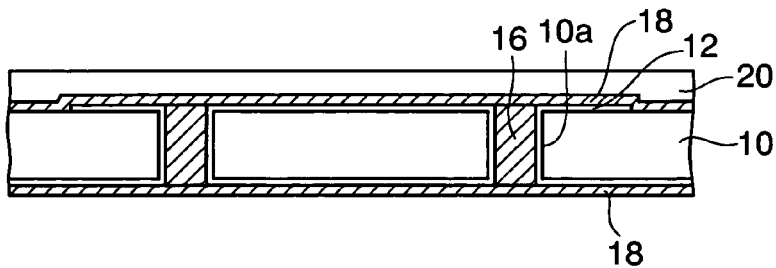
Figure 1K:
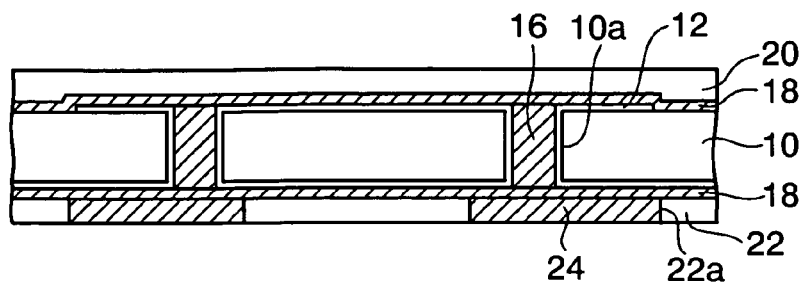
Figure 1L:
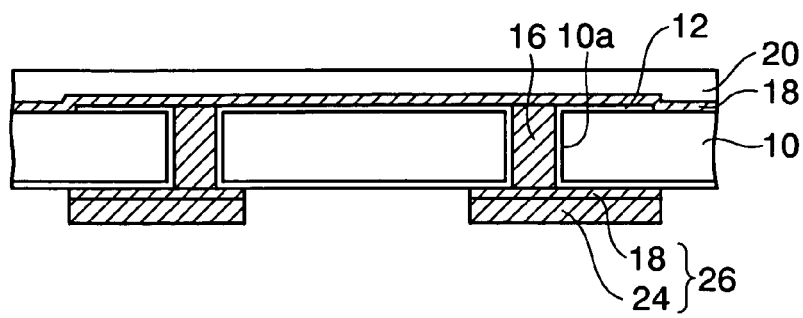
Figure 1M:
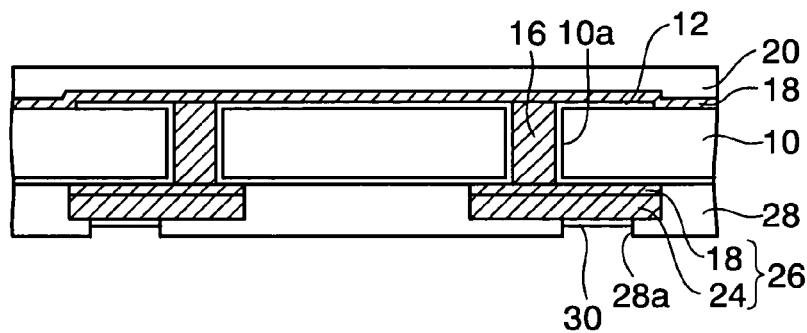
Figure 1N:
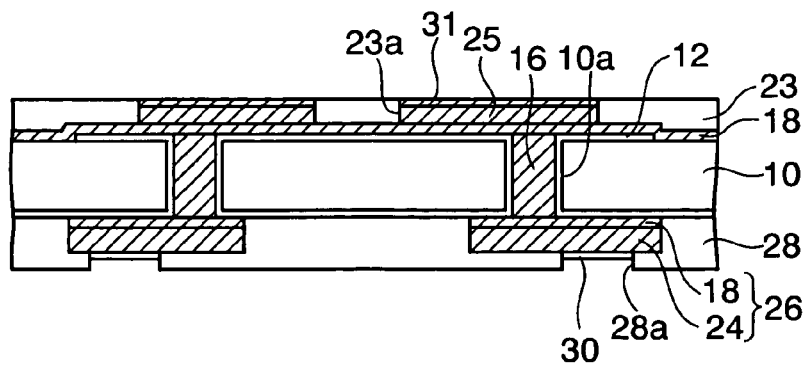
Figure 1O:
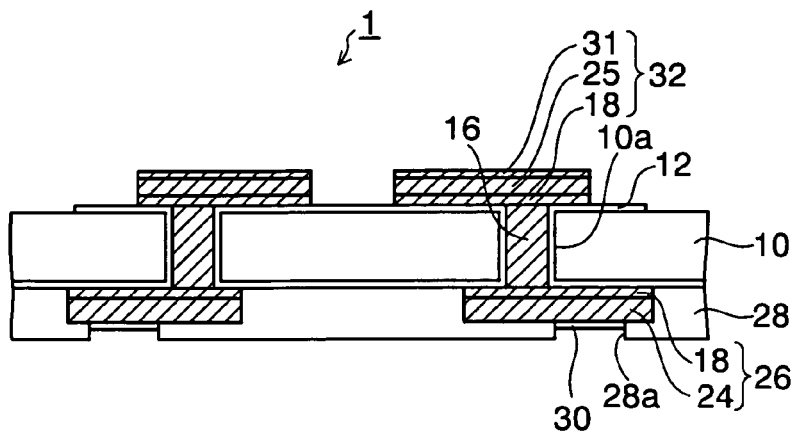
Figure 1P:
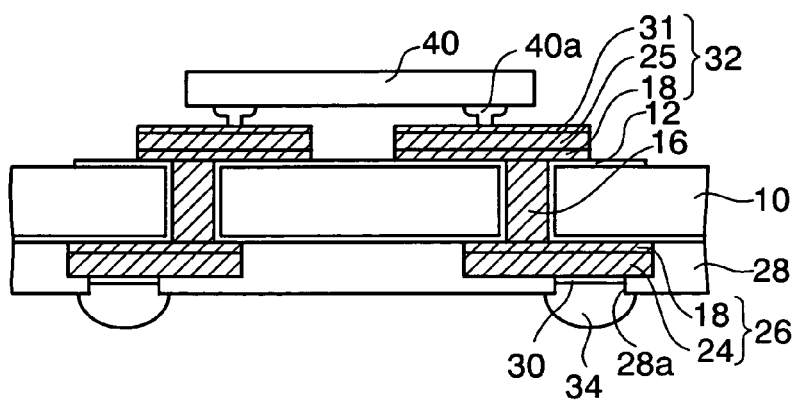
Figure 1Q:
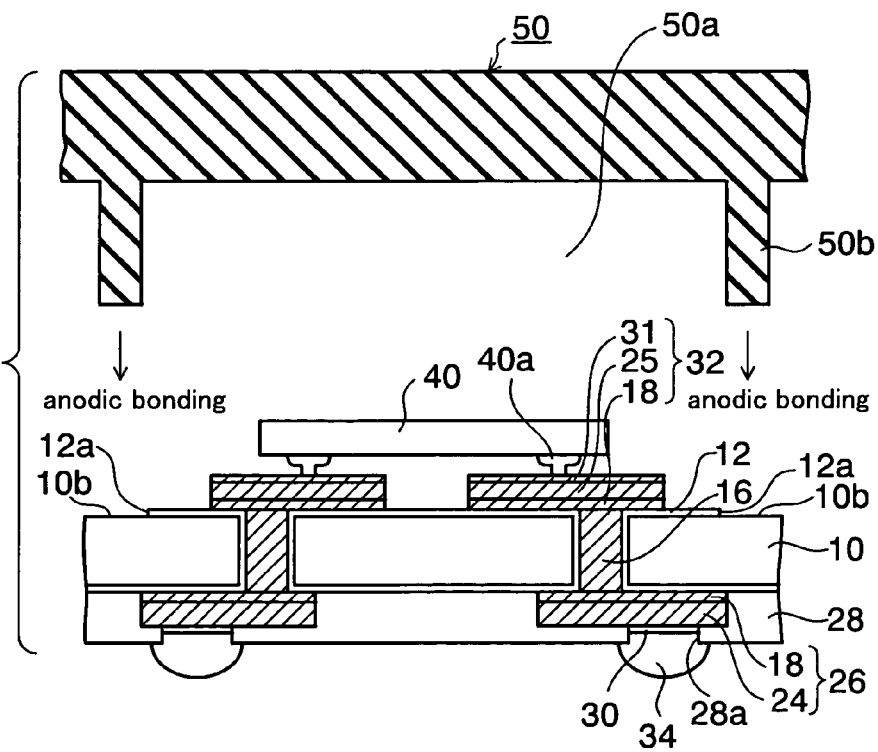
Figure 2:
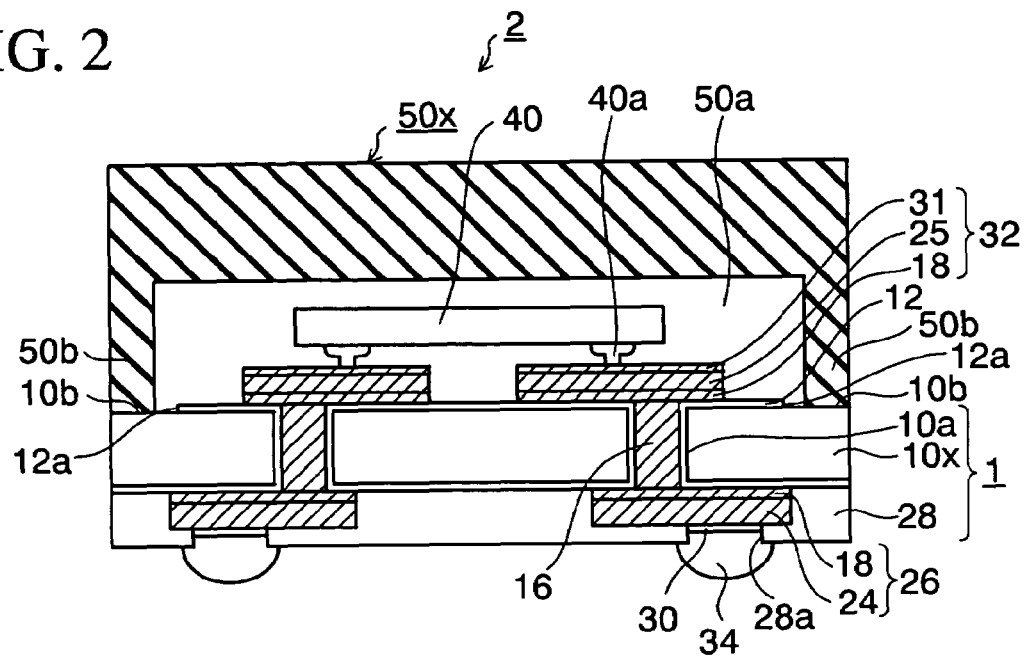
FIG. 2 is a cross-sectional view showing the electronic parts packaging structure of the first embodiment of the present invention.

FIGS. 1A to 1Q are cross-sectional views showing a method of manufacturing an electronic parts packaging structure of a first embodiment of the present invention, and FIG. 2 is a cross-sectional view showing the electronic parts packaging structure of the first embodiment. First, as shown in FIG. 1A, a silicon wafer 10 having a thickness of approximately 625 μm is prepared as a silicon substrate. Then, as shown in FIG. 1B, one surface of the silicon wafer 10 is ground by a back grinder (BG), thus obtaining the silicon wafer 10 the thickness of which is reduced to 50 to 300 μm (preferably approximately 200 μm). On the silicon wafer 10, a plurality of device mounting regions (or device forming regions) are delimited. The silicon wafer 10 is divided in a later step, and individual electronic parts packaging structures are obtained.

Next, as shown in FIG. 1C, through holes 10a penetrating the silicon wafer 10 in the thickness direction thereof are formed by forming on the silicon wafer 10 a mask (not shown) having opening portions provided therein, and by etching the silicon substrate 10 through the opening portions by RIE. The diameters of the through holes 10a are set in the range of, for example, 30 to 60 μm. Subsequently, the mask is removed.

Furthermore, as shown in FIG. 1D, an insulating layer 12 made of a silicon oxide layer which has a thickness of approximately 500 nm is formed on both surfaces of the silicon wafer 10 and the inner surfaces of the through holes 10a by thermally oxidizing the silicon wafer 10. Alternatively, a silicon oxide layer or a silicon nitride layer may be formed by CVD on the entire surface of the silicon wafer 10 to be used as the insulating layer 12.

Subsequently, as shown in FIG. 1E, an opening portion 12a is formed in the insulating layer 12 by forming a resist film (not shown) having a ring-shaped opening portion provided in a peripheral portion of each device mounting region of the silicon wafer 10, and by etching the insulating layer 12 through the opening portion using buffered hydrofluoric acid or the like. Thus, the silicon wafer 10 is exposed in a ring shape in the peripheral portion of each device mounting region of the silicon wafer 10 to serve as a bonding portion 10b. Then, the resist film is removed. The bonding portion 10b of the silicon wafer 10 is formed in order to anodically bond a sealing cap (glass) to the peripheral portion of each device mounting region of the silicon wafer 10, as described later.

Next, as shown in FIG. 1F, copper foil 14 is glued onto the lower surface of the silicon wafer 10 with an adhesive material 13, and then the adhesive material 13 under the through holes 10a of the silicon wafer 10 is removed by ashing to expose the copper foil 14 at the bottoms of the through holes 10a. In this way, the silicon wafer 10 including the through holes 10a is placed on the copper foil 14.

Moreover, as shown in FIG. 1G, through electrodes 16 are formed by performing metal (Cu) plating on the through holes 10a of the silicon wafer 10 from lower portions thereof to upper portions thereof by electroplating using the copper foil 14 as a plating power-supplying layer. Then, as shown in FIG. 1H, the copper foil 14 and the adhesive material 13 are removed from the silicon wafer 10. The copper foil 14 is etched by an $H_2SO_4/H_2O_2$ solution to be removed, and the adhesive material 13 is removed by ashing.

Subsequently, as shown in FIG. 1I, the upper and lower portions of the through electrodes 16 which protrude from the upper and the lower surfaces of the silicon wafer 10 are removed by polishing, thus planarizing the upper and the lower sides of the silicon wafer 10.

Next, as shown in FIG. 1J, a chromium (Cr) layer having a film thickness of 50 nm and a copper (Cu) layer having a film thickness of 750 nm are sequentially formed by sputtering on each side of the silicon wafer 10, whereby a seed layer 18 is obtained on each side of the silicon wafer 10. Furthermore, a protective sheet 20 is stuck to the top of the seed layer 18 on the upper side of the silicon wafer 10.

Then, as shown in FIG. 1K, a resist film 22 having opening portions 22a provided therein is formed on the seed layer 18 on the lower side of the silicon wafer 10. The opening portions 22a of the resist film 22 are formed in portions where a lower-side wiring layer formed on the lower side of the silicon wafer 10 is arranged.

Subsequently, as also shown in FIG. 1K, a metal layer 24 made of Cu or the like which has a film thickness of, for example, approximately 5 μm is formed in the opening portions 22a of the resist film 22 by electroplating using the seed layer 18 on the lower side of the silicon wafer 10 as a plating power-supplying layer. Furthermore, as shown in FIG. 1L, the resist film 22 is removed, and then the seed layer 18 is etched using the metal layer 24 as a mask. Thus, a lower-side wiring layer 26 is obtained which is composed of the metal layer 24 and the seed layer 18, and which is electrically connected to lower portions of the through electrodes 16.

Next, as shown in FIG. 1M, a passivation film 28 having opening portions 28a provided on the lower-side wiring layer 26 is formed on the lower side of the silicon wafer 10. A method of forming the passivation film 28 will be described. Photosensitive polyimide resin having a film thickness of approximately 10 μm is coated by spin coating, and then exposure and development are performed to it, and then it is cured to be hardened in an atmosphere at 350° C. Moreover, by electroplating using the seed layer 18 on the upper side of the silicon wafer 10, the through electrodes 16, and the lower-side wiring layer 26 as a plating power-supplying path, Ni/Au plating (e.g., 2 μm/0.5 μm in thickness) is performed on portions of the lower-side wiring layer 26 in the opening portions 28a of the passivation film 28, thus forming external connection pads 30.

Subsequently, as shown in FIG. 1N, the protective sheet 20 is removed from the silicon wafer 10. Then, as in the aforementioned method of forming the metal layer 24 of the lower-side wiring layer 26, a resist film 23 having opening portions 23a provided therein is formed on the seed layer 18 on the upper side of the silicon wafer 10, and a metal layer 25 made of Cu or the like and a Ni/Au plated layer 31 are sequentially formed in the opening portions 23a of the resist film 23 by electroplating using the seed layer 18 on the upper side of the silicon wafer 10 as a plating power-supplying layer. The film thickness of the metal layer 25 is, for example, 5 μm; and that of the Ni/Au plated layer 31 is, for example, 2 μm/0.5 μm.

Thereafter, as shown in FIG. 1O, the resist film 23 is removed, and then the seed layer 18 is etched using the Ni/Au plated layer 31 and the metal layer 25 as a mask, whereby an upper-side wiring layer 32 which is composed of the Ni/Au plated layer 31, the metal layer 25, and the seed layer 18, and which is electrically connected to upper portions of the through electrodes 16, is obtained on the upper side of the silicon wafer 10.

Thus, a structure is obtained in which the upper-side and the lower-side wiring layers 32 and 26 formed on the two sides of the silicon wafer 10 are connected to each other through the through electrodes 16. By the above-described process, a silicon circuit substrate 1 is obtained which serves as an interposer for constructing an electronic parts packaging structure of this embodiment.

Next, as shown in FIG. 1P, a semiconductor device 40 provided with stud bumps 40a made of gold (Au) is prepared, and the stud bumps 40a of the semiconductor device 40 are bonded to the Ni/Au plated layer 31 of the upper-side wiring layer 32 by ultrasonic bonding. As the semiconductor device 40, a silicon chip or the like having a thickness of approximately 50 to 100 µm is used. Furthermore, as also shown in FIG. 1P, flux is coated over the lower side of the silicon wafer 10, solder balls are mounted on the external connection pads 30 on the lower-side wiring layer 26, and then the flux is cleaned, whereby forming external connection terminals 34 electrically connected to the lower-side wiring layer 26.

Subsequently, as shown in FIG. 1Q, a glass sealing cap substrate 50 of integrated type is prepared in which a plurality of cavities 50a are provided. In the sealing cap substrate 50, protruded bonding portions 50b are formed which are placed on a glass wafer to be contiguous in the form of a grid, whereby the plurality of cavities 50a are constituted. Furthermore, the protruded bonding portions 50b of the sealing cap substrate 50 are provided in portions corresponding to the aforementioned bonding portions 10b (peripheral portion of each device mounting region) of the silicon wafer 10, and the cavities 50a are provided to correspond to portions in which the semiconductor devices 40 are accommodated.

The protruded bonding portions 50b and the cavities 50a of the sealing cap substrate 50 are formed by forming a mask having required opening portions on the glass wafer and by processing portions of the glass wafer which are exposed through the opening portions by using sandblast method. Alternatively, a sealing cap substrate 50 having a similar structure may be made by pouring melted glass into a required mold.

Next, as also shown in FIG. 1Q, each protruded bonding portion 50b of the sealing cap substrate 50 is anodically bonded to the bonding portion 10b of each device mounting region of the silicon wafer 10. As conditions for the anodic bonding, for example, a voltage of 500 V to 1 kV is applied between the silicon wafer 10 and the sealing cap substrate 50 in a state in which they are heated to 300 to 400° C. By this matter, electrostatic attraction generates between the silicon wafer 10 and the sealing cap substrate 50 (glass), and the chemical bonding at the interface therebetween causes, whereby the protruded bonding portions 50b of the sealing cap substrate 50 is bonded to the bonding portions 10b of the silicon wafer 10. Furthermore, the anodic bonding is performed in a vacuum atmosphere, and the semiconductor device 40 is accommodated in the cavity 50a of the sealing cap substrate 50 and hermetically sealed in a state in which the inside of the cavity 50a of the sealing cap substrate 50 is in a vacuum state. It should be noted that, in the case where an electronic parts which does not have to be operated in a vacuum atmosphere is used, the cavity 50a may be in a normal atmosphere.

Thereafter, as shown in FIG. 2, the silicon wafer 10 and the sealing cap substrate 50 are divided by cutting so that each device mounting region can be obtained, thus obtaining individual electronic parts packaging structures 2.

As shown in FIG. 2, in the electronic parts packaging structure 2 of this embodiment, the silicon circuit substrate 1 is used as an interposer. In the silicon circuit substrate 1, the through holes 10a are provided in the silicon substrate 10x, and both surfaces of the silicon substrate 10x and the inner surfaces of the through holes 10a are covered with the insulating layer 12. Furthermore, the through electrodes 16 are formed in the through holes 10a of the silicon substrate 10x. Moreover, the upper-side wiring layer 32 electrically connected to the through electrodes 16 is formed on the insulating layer 12 on the upper side of the silicon substrate 10x, and the lower-side wiring layer 26 electrically connected to the through electrodes 16 is formed on the insulating layer 12 on the lower side of the silicon substrate 10x as well. Thus, in the silicon circuit substrate 1, the upper-side and the lower-side wiring layers 32 and 26 are connected to each other through the through electrodes 16.

Furthermore, the passivation film 28 having the opening portions 28a provided on the lower-side wiring layer 26 is formed on the lower side of the silicon substrate 10x, and the external connection pads 30 are formed on portions of the lower-side wiring layer 26 in the opening portions 28a. Moreover, the external connection terminals 34 are provided on the external connection pads 30 on the lower-side wiring layer 26.

Moreover, the ring-shaped opening portion 12a is provided in a portion of the insulating layer 12 in the peripheral portion of the silicon substrate 10x. Thus, the bonding portion 10b of the silicon substrate 10x is delimited in the opening portion 12a.

Also, the stud bumps 40a of the semiconductor device 40 are flip-chip bonded to the Ni/Au plated layer 31 of the upper-side wiring layer 32 of the silicon circuit substrate 1. Furthermore, the protruded bonding portion 50b of the sealing cap 50x made of glass in which the cavity 50a is provided in a central main portion is anodically bonded to the bonding portion 10b in the peripheral portion of the silicon substrate 10x. In this way, the semiconductor device 40 mounted on the silicon circuit substrate 1 is accommodated in the cavity 50a of the sealing cap 50x, and is hermetically sealed.

In this embodiment, since the silicon circuit substrate 1 is used as an interposer, high-density wiring can be easily formed, and it becomes possible to mount a high-performance semiconductor device 40. Moreover, since the through electrodes 16 enable conduction between the two sides of the silicon circuit substrate 1, wiring length becomes shorter, and it becomes possible to cope with a higher signal speed in an electronic parts for high frequency applications.

The semiconductor device 40 used in this embodiment is a high-performance one in which, for example, a low-dielectric-constant (low-k) insulating material is used as an insulating layer for multilayered wiring and the like, and there is apprehension that the reliability of the insulating layer may be lowered by external stresses and moisture from outside air. In this embodiment, such a high-performance semiconductor device 40 can be mounted on the silicon circuit substrate 1, and the semiconductor device 40 can be accommodated in the sealing cap 50x and hermetically sealed. Accordingly, since the sealing cap 50x can block the intrusion of moisture or the like from outside air, it becomes possible to mount even a semiconductor device 40 having such characteristics in a state in which sufficient reliability is ensured.

Furthermore, since the thermal expansion coefficients of the silicon circuit substrate 1 and of the semiconductor device 40 (silicon chip) mounted thereon can be set equal to each other, the occurrence of thermal stresses caused by the difference in thermal expansion coefficients is prevented. Accordingly, the reliability of the semiconductor device 40 can be improved. Also, since the gap between the semiconductor device 40 and the silicon circuit substrate 1 is not filled with underfill resin having a thermal expansion coefficient different from that of the semiconductor device 40 (silicon chip) but is in a state in which a hollow is left, a structure in which thermal stresses are reduced to a minimum can be obtained.

Furthermore, since the sealing cap 50x made of glass in which the cavity 50a is provided is fixed to the silicon circuit substrate 1 by anodic bonding, the semiconductor device 40 mounted on the silicon circuit substrate 1 can be easily hermetically sealed at low cost.

Figure 3:
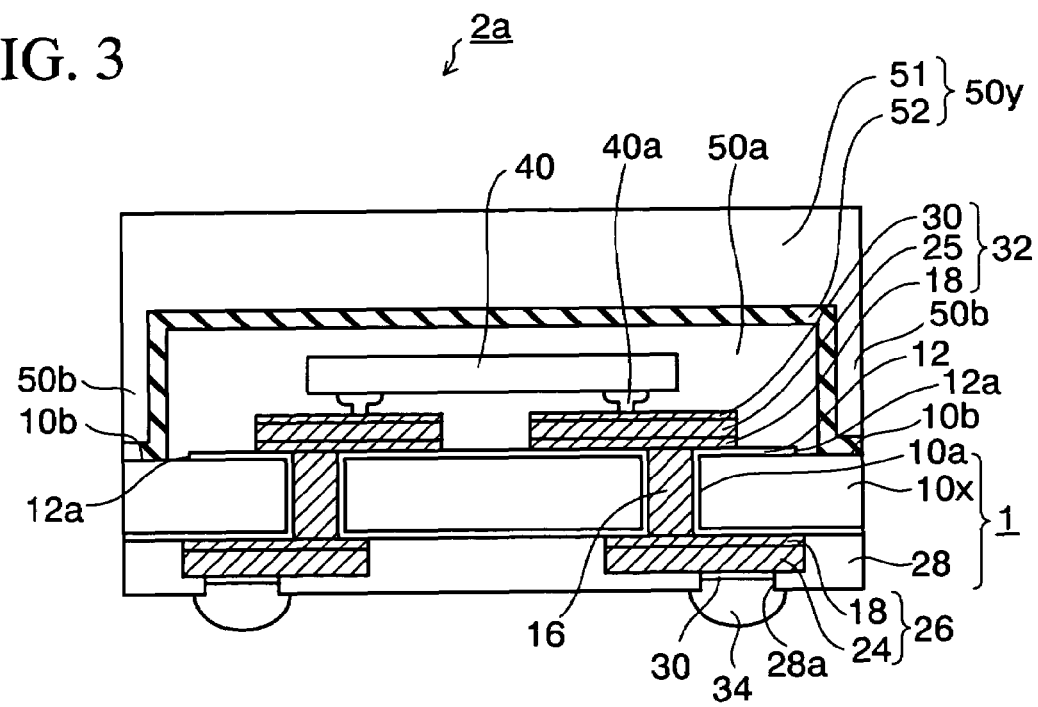
FIG. 3 is a cross-sectional view showing an electronic parts packaging structure of a variation of the first embodiment of the present invention.

FIG. 3 shows an electrical parts packaging structure 2a of a variation of the first embodiment. As shown in FIG. 3, a sealing cap 50y used in the electronic parts packaging structure 2a of the variation is composed of a silicon portion 51 in which the cavity 50a is provided in a central main portion, and a glass portion 52 formed on a surface of the silicon portion 51 where the cavity 50a is provided (the inner surface of the cavity 50a and an end portion of the protruded bonding portion 50b). Furthermore, the glass portion 52 at the end of the protruded bonding portion 50b of the sealing cap 50y is anodically bonded to the bonding portion 10b of the silicon substrate 10x. To obtain such a sealing cap 50y, first, a mask having an opening portion is formed on a cap silicon substrate, and the cap silicon substrate is etched by RIE through the opening portion to form the cavity 50a and the protruded bonding portion 50b. Subsequently, $SiO_2$ is formed by sputtering on the cap silicon substrate from the surface side where the cavity 50a is provided, thus obtaining the glass portion 52. Then, by the aforementioned step of FIG. 1Q, the glass portion 52 at the end of the protruded bonding portion 50b of the cap silicon substrate is anodically bonded to the bonding portion 10b of the silicon wafer 10.

It should be noted that in this embodiment, any sealing cap can be used as long as it can be anodically bonded to the bonding portion 10b of the silicon substrate 10x. Accordingly, it is acceptable that glass is provided at least at an end portion (bonding part) of the protruded bonding portion in the sealing cap 50y of FIG. 3. Moreover, in the sealing cap 50y of FIG. 3, other material such as metal may be used instead of the silicon portion 51.

Second Embodiment

Figure 4:
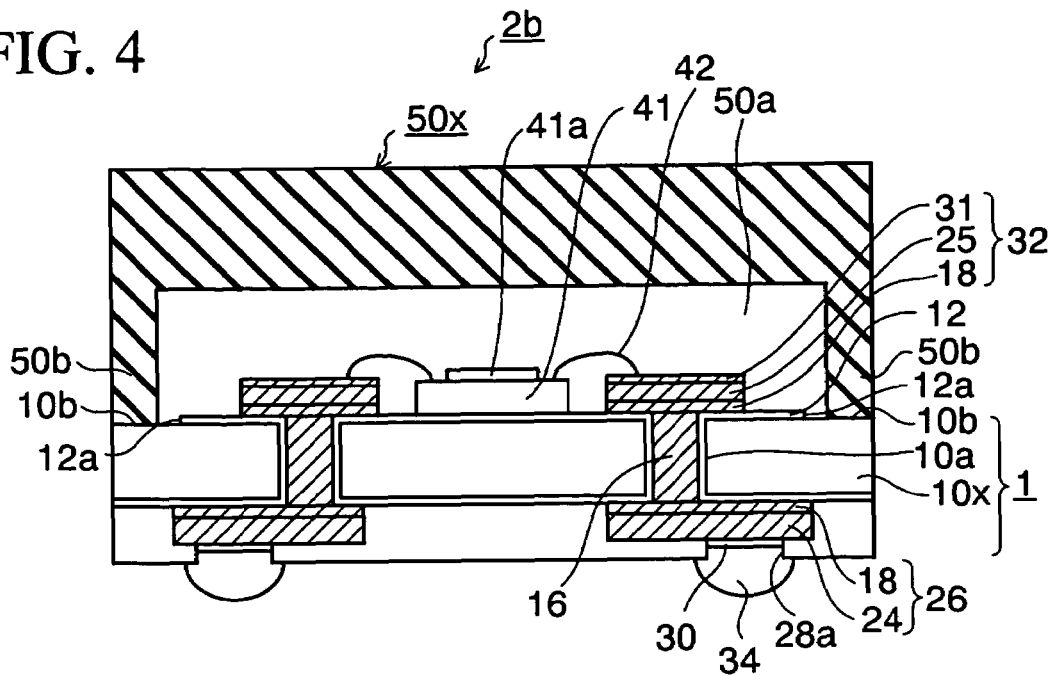
FIG. 4 is a cross-sectional view showing an electronic parts packaging structure of a second embodiment of the present invention.

FIG. 4 is a cross-sectional view showing an electronic parts packaging structure of a second embodiment of the present invention. In the second embodiment, an imaging device such as a CMOS sensor is mounted as an electronic parts on a silicon circuit substrate to be similarly hermetically sealed with a sealing cap. In the second embodiment, the same components as those of the first embodiment are denoted by the same reference numerals, and will not be described in detail.

As shown in FIG. 4, in the electronic parts packaging structure 2b of the second embodiment, an imaging device 41 is fixed to the top of the insulating layer 12 of the silicon circuit substrate 1 having a structure similar to that of the first embodiment in a state in which an imaging portion 41a of the imaging device 41 is faced up, using an adhesive layer (not shown). As the imaging device 41, a semiconductor image sensor of a CCD type, a CMOS type, or the like is used.

Furthermore, connecting portions on the upper side of the imaging device 41 are electrically connected to the upper-side wiring layer 32 of the silicon circuit substrate 1 by wires 42. Moreover, the protruded bonding portion 50b of the sealing cap 50x made of glass in which the cavity 50a is provided in a central main portion is anodically bonded to the bonding portion 10b of the silicon substrate 10x. In this way, the imaging device 41 is accommodated in the cavity 50a of the sealing cap 50x to be hermetically sealed. Thus, outside light enters the imaging portion 41a of the imaging device 41 through the transparent sealing cap 50x. Based on this, the imaging device 41 outputs an imaging signal, and an image is obtained.

Alternatively, another constitution may be employed in which, in addition to the imaging device 41, an optical semiconductor device such as a laser diode or a light-receiving device is mounted in a state in which a light-emitting or right-receiving surface thereof is faced up, and is similarly hermetically sealed with the sealing cap 50x.

The second embodiment has effects similar to those of the first embodiment.

Third Embodiment

Figure 5:
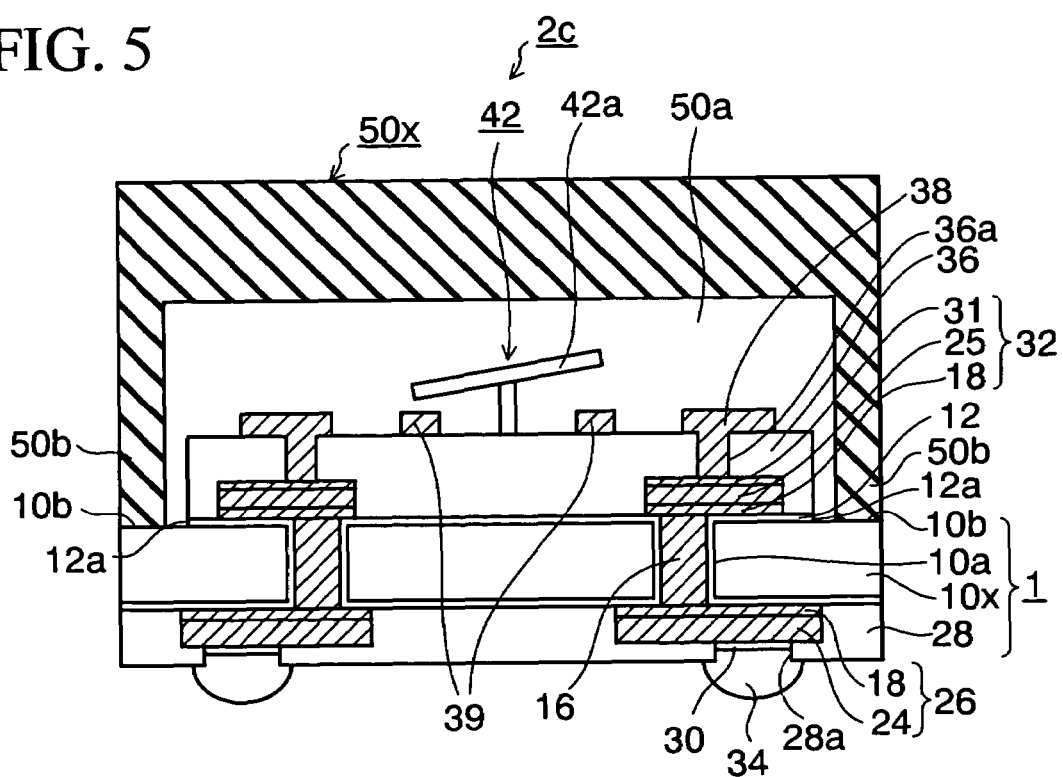
FIG. 5 is a cross-sectional view showing an electronic parts packaging structure of a third embodiment of the present invention.

FIG. 5 is a cross-sectional view showing an electronic parts packaging structure of a third embodiment of the present invention.

In the third embodiment, a MEMS device is formed as an electronic parts on a silicon circuit substrate to be similarly hermetically sealed with a sealing cap. In the third embodiment, the same components as those of the first embodiment are denoted by the same reference numerals, and will not be described in detail.

As shown in FIG. 5, in an electronic parts packaging structure 2c of the third embodiment, a protective layer 36 having via holes 36a provided therein is formed on the upper-side wiring layer 32 of the silicon circuit substrate 1 having a structure similar to that of the first embodiment. Furthermore, a second wiring layer 38 electrically connected to the upper-side wiring layer 32 through the via holes 36a is formed on the protective layer 36. On the protective layer 36, a switch device 42 including a movable portion (cantilever) 42a having a supporting point is formed as a MEMS device. Moreover, electrodes 39 are provided on portions of the protective layer 36 which correspond to both ends of the movable portion 42a of the switch device 42, respectively.

The switch device 42 has a mechanism in which a switch circuit is turned on, when driving energy is supplied to the movable portion 42a made of a magnetic alloy by the action of a plane coil (not shown) provided in the protective layer 36, and the movable portion 42a tilts to come into contact with the electrode 39.

In the third embodiment, the switch device 42 having such a structure is formed on the silicon circuit substrate 1, and the protruded bonding portion 50b of the sealing cap 50x made of glass is anodically bonded to the bonding portion 10b of the silicon substrate 10x as in the first embodiment. In this way, the switch device 42 is accommodated in the cavity 50a of the sealing cap 50x to be hermetically sealed.

Although the switch device 42 has been taken as an example of a MEMS device, a form may be employed in which an acceleration sensor, a digital mirror device (DMD), or the like is formed on the silicon circuit substrate 1 to be similarly hermetically sealed with the sealing cap 50x.

Also in the third embodiment, in the case where a MEMS device is used which does not necessarily require the transparent sealing cap 50x, the sealing cap 50y in which the glass portion 52 is provided on the same side of the silicon portion 51 that the cavity 50a is formed may be used as in the variation of the first embodiment.

The third embodiment has effects similar to those of the first embodiment.

What is claimed is:

1. An electronic parts packaging structure comprising:
   a silicon circuit substrate having a structure in which wiring layers on both sides thereof are connected to each other with a through electrode;
   an electronic parts mounted or formed on the silicon circuit substrate; and
   a sealing cap including a ring-shaped protruded bonding portion, and having a structure in which a cavity is constituted by the protruded bonding portion, wherein the sealing cap is composed of a silicon portion having the cavity provided therein, and at least an inner surface portion of the cavity and a bonding part of the protruded bonding portion are made of glass, and the bonding part made of glass of the sealing cap being bonded to a bonding portion made of a silicon surface of the silicon circuit substrate,
   wherein the electronic parts is hermetically sealed in the cavity of the sealing cap.

2. The electronic parts packaging structure according to claim 1, wherein the electronic parts is any one of a semiconductor device and an imaging device, which is electrically connected to the wiring layer and is mounted thereon.

3. The electronic parts packaging structure according to claim 1, wherein the electronic parts is a MEMS device built into the silicon circuit substrate.

4. The electronic parts packaging structure according to claim 2, wherein the electronic parts is the semiconductor device connected to the wiring layer by flip-chip bonding, and a gap between the semiconductor device and the silicon circuit substrate is a hollow without being filled with resin.

* * * * *